United States Patent
Kook et al.

(10) Patent No.: US 7,277,977 B2
(45) Date of Patent: Oct. 2, 2007

(54) DRAM FOR HIGH-SPEED DATA ACCESS

(75) Inventors: Jeong-Hoon Kook, Ichon-shi (KR); Sang-Hoon Hong, Ichon-shi (KR); Se-Jun Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 263 days.

(21) Appl. No.: 10/330,482

(22) Filed: Dec. 30, 2002

(65) Prior Publication Data

US 2004/0015646 A1 Jan. 22, 2004

(30) Foreign Application Priority Data

Jul. 19, 2002 (KR) ............... 10-2002-0042380

(51) Int. Cl.
*G06F 12/00* (2006.01)
(52) U.S. Cl. .................................. 711/5; 711/105
(58) Field of Classification Search ........... 711/105, 711/5

See application file for complete search history.

(56) References Cited

U.S. PATENT DOCUMENTS

| | | | | |
|---|---|---|---|---|
| 6,229,752 | B1* | 5/2001 | Ayukawa et al. | 365/230.03 |
| 2001/0038567 | A1 | 11/2001 | Ishikawa | |
| 2003/0204667 | A1* | 10/2003 | Ji et al. | 711/105 |

FOREIGN PATENT DOCUMENTS

JP 06-348593 12/1994

* cited by examiner

*Primary Examiner*—Matthew Kim
*Assistant Examiner*—Sheng-Jen Tsai
(74) *Attorney, Agent, or Firm*—Lowe Hauptman Ham & Berner LLP

(57) ABSTRACT

A DRAM with a general interleaving scheme for data input/output uses a normal bank structure. The DRAM provides a high-performance without consideration of a data access pattern. In order to implement the high-performance, the DRAM includes a plurality of normal banks, at least one cache bank, which has the same data access scheme with the normal banks, for selectively storing data with a normal bank selected at a read mode and a controller for controlling the access to the cache bank and the selected normal bank when continuous read commands are occurred to the selected normal bank.

19 Claims, 12 Drawing Sheets

FIG. 15
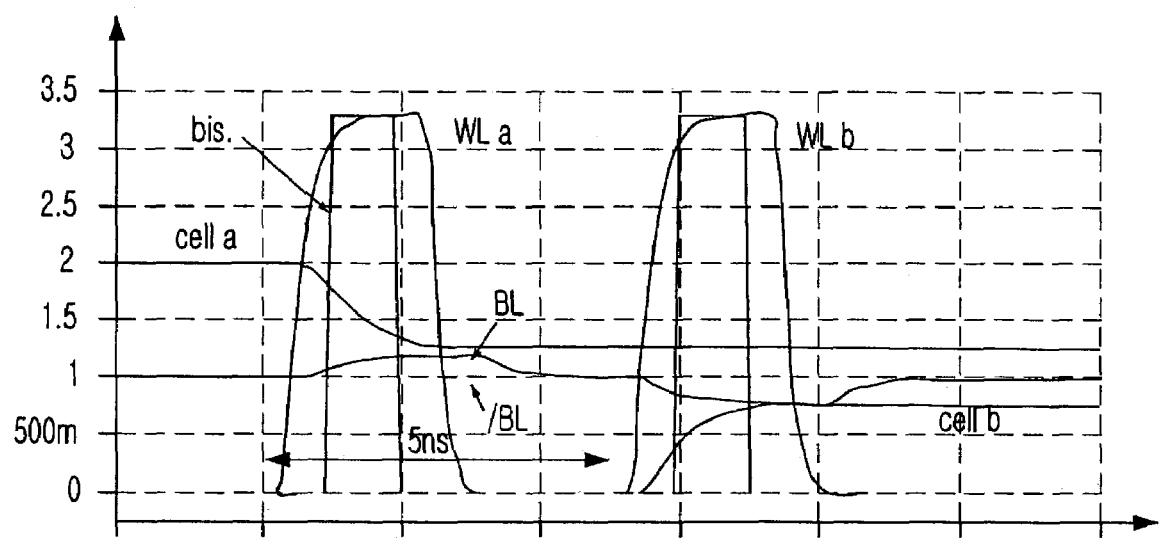
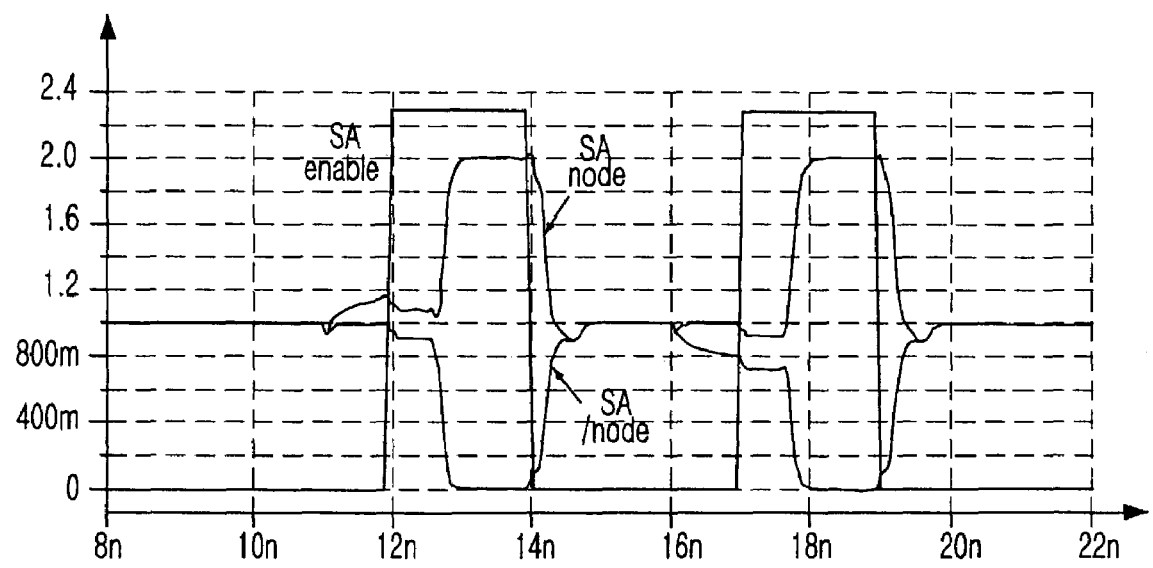

DRAM FOR HIGH-SPEED DATA ACCESS

FIELD OF THE INVENTION

The present invention relates to a semiconductor memory device; and, more particularly, to a dynamic random access memory (DRAM) capable of reading and writing data with high-speed by using a normal bank.

DESCRIPTION OF RELATED ART

Recently, an operating speed of a central processing unit (CPU) has been substantially improved as much as getting over that of DRAM. As a result, there are occurring various problems caused by a lower operating speed of DRAM than that of CPU relatively. Therefore, in order to resolve these problems, various structures for high-performance DRAM have been developed. At first, a method that reduces physical parameters such as the resistance and the capacitance of a bit line and a word line can be considered because the data access time of DRAM depends strongly on the parameters. However, when decreasing the values of the physical parameters by making the size of a unit cell array smaller, the data access time become shorter, whereas the cell efficiency is also lowered. Therefore, this method has a limitation.

Meanwhile, a normal bank DRAM, which includes a plurality of banks and operates in an interleave mode, has been developed for high-speed data input/output.

The normal bank DRAM using the interleave mode can transmit a large amount of data in a given time by using a bank interleaving method in which the plurality of banks are controlled by a memory controller to thereby continuously output data from each bank. That is, even while a piece of data from a bank is read and re-written, another piece of data from a nearby bank can be also read. So, it looks like that the continuous data appear on the outside without a re-writing time. For the purpose, each bank has its own row decoder and column decoder, and operates independently with other banks.

However, the normal bank DRAM using the interleaving mode has a problem that cannot read and write the data with high-speed when the data access is massed in the same bank continuously. That is, the access speed of DRAM substantially depends on a pattern of data inputted or outputted.

As another method, there has been proposed a DRAM structure, which reduces the access time at cache hit by integrating DRAM with a cache bank of SRAM (Static RAM) that has a relatively high operating speed.

Since, however, SRAM usually needs 4 times area compared with DRAM of the same capacity, the area of DRAM using the SRAM cache bank is increased. Also, because a former data input/output mechanism is executed when a cache miss is occurred at the time of the data access, there is a drawback that the access time of DRAM is strongly affected by the data access pattern.

SUMMARY OF THE INVENTION

It is, therefore, an object of the present invention to provide a DRAM with a general interleaving mode for data input/output by using a normal bank structure, capable of performing a high-speed data input/output without consideration of a data access pattern.

In accordance with an embodiment of the present invention, a high-performance DRAM includes: a plurality of normal banks; at least one cache bank, which has the same data access scheme with the normal banks, for selectively storing data with a normal bank selected at a read mode; and a controller for controlling the access to the cache bank and the selected normal bank when continuous read commands are occurred to the selected normal bank.

In accordance with another embodiment of the present invention, a DRAM includes: a plurality of normal banks; a first and a second cache bank, which have the same data access scheme with the normal banks; and a controller for making data outputted according to an interleaving scheme when a read access is occurred to each other normal bank alternatively, making the data outputted from a selected normal bank and moved to the first or the second cache bank when continuous read commands are occurred to the one selected normal bank.

For DRAM including the normal bank structure, the present invention provides high-performance DRAM by accessing data continuously without re-write operation, when the data accesses to the same bank continuously, since there are two cache banks that have the same structure with the normal bank. In this case, storing the data to two cache banks appropriately can preserve the lost data caused by absence of re-write operation.

BRIEF DESCRIPTION OF THE DRAWINGS

The above and other objects and features of the instant invention will become apparent from the following description of preferred embodiments taken in conjunction with the accompanying drawings, in which:

FIG. 15 is a simulation waveform diagram showing an operation of the DRAM shown in FIG. 1.

DETAILED DESCRIPTION OF THE INVENTION

Hereinafter, a preferred embodiment of the present invention will be described referring to the accompanying drawings. This embodiment helps those skilled in the art to implement the present invention.

Figure 1:
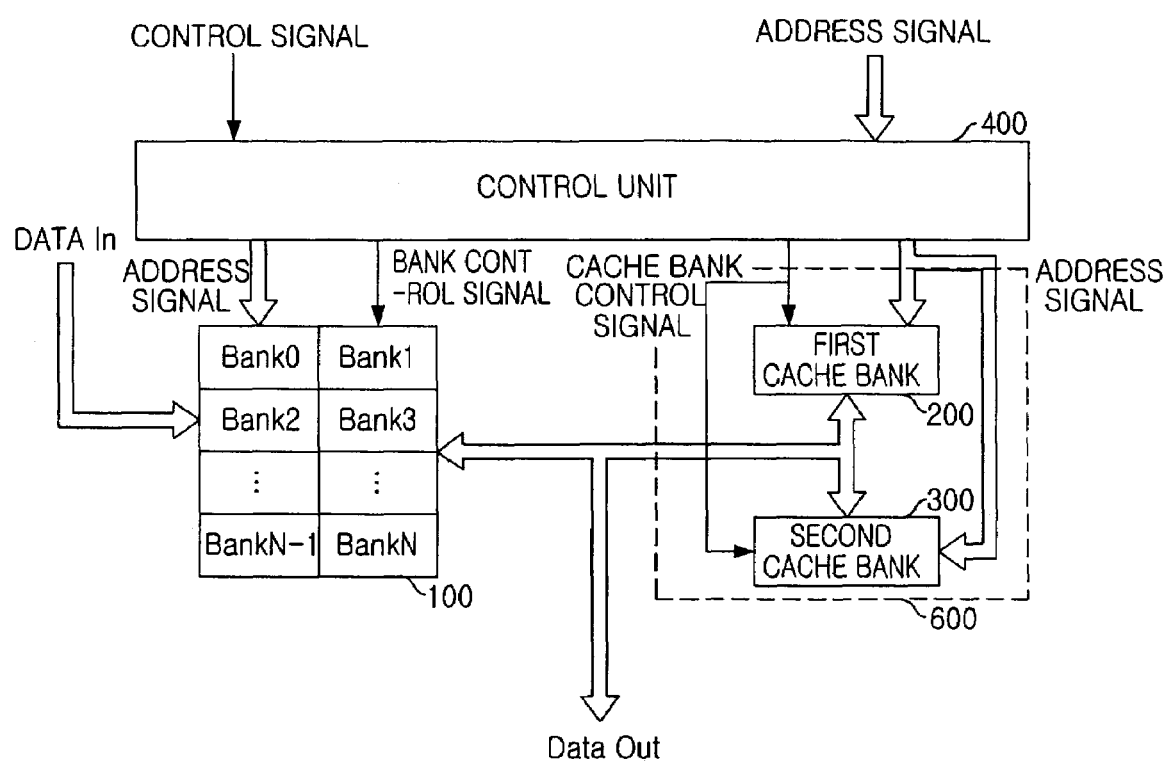
FIG. 1 provides a block diagram of a DRAM in accordance with a preferred embodiment of the present invention.

FIG. 1 provides a block diagram of a DRAM in accordance with a preferred embodiment of the present invention.

As shown in FIG. 1, the inventive DRAM includes a bank normal bank unit 100 having a plurality of normal banks Bank0 to BankN; a cache bank unit 600 containing one or more cache banks 200 and 300, which have the same data access scheme as that of the normal bank unit 100, for storing the data outputted from a selected normal bank, e.g., Bank0, at a read mode; and a control unit 400 for controlling the access to the normal bank, e.g. Bank, and the cache banks 200 and 300 when there are continuous read commands for the selected normal bank, Bank.

More particularly, two cache banks 200 and 300 have the same data access scheme as those of the normal banks, and the control unit 400 controls the normal banks to output data in the interleaving mode when there is an alternative read access to each other normal bank, controls a selected one normal bank to output certain data when there is a continuous read access to the selected normal bank and to provide the certain data to the first or second cache bank 200 or 300.

Figure 2:
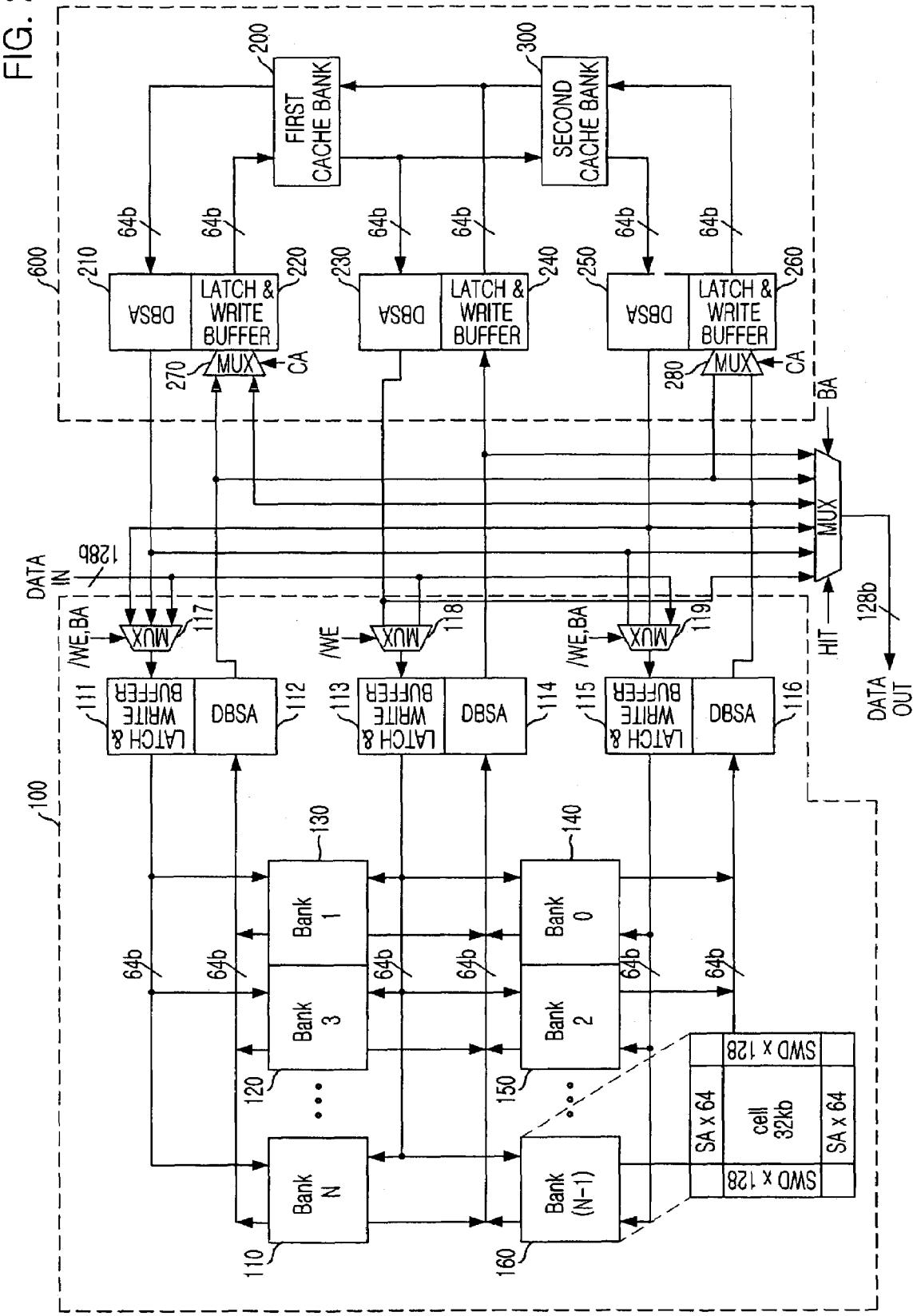
FIG. 2 describes a block diagram of a normal bank and a cache bank employed in the DRAM shown in FIG. 1.

FIG. 2 depicts a block diagram of the normal bank unit 100 and the cache bank unit 600 employed in the DRAM shown in FIG. 1.

As shown in FIG. 2, the normal bank unit 100 includes latch & write buffers 111, 113 and 115, which play a part in a data latch and buffer to store data at a unit cell of a bank corresponding an address signal, output sense amplifiers 112, 114 and 116 for amplifying outputted data, and a plurality of banks 110 to 160, which include unit cells and sense amplifiers, for independently inputting/outputting data.

The cache bank unit 600 includes the first and the second cache banks 200 and 300 that have the same structure with a bank of the normal bank unit 100, latch & write buffers 220, 240 and 260 for latching data outputted from the normal bank unit 100, transmitting the data to the first cache bank 200 or the second cache bank 300 in response to control signals provided from the control unit 400, and sense amplifiers 210, 230 and 250 for amplifying the data from the first and the second cache banks 200 and 300 and outputted amplified data to the normal bank unit 100 or to outside. The first and the second cache banks have the same storage capacity with that of a normal bank.

And, in order to synchronize the timing when data are stored in the banks Bank0 to BankN or the cache banks 200 and 300, there are multiplexers 117, 118, 119, 270 and 280, which operate in response to various control signals /WE, BA and CA.

Figure 3:
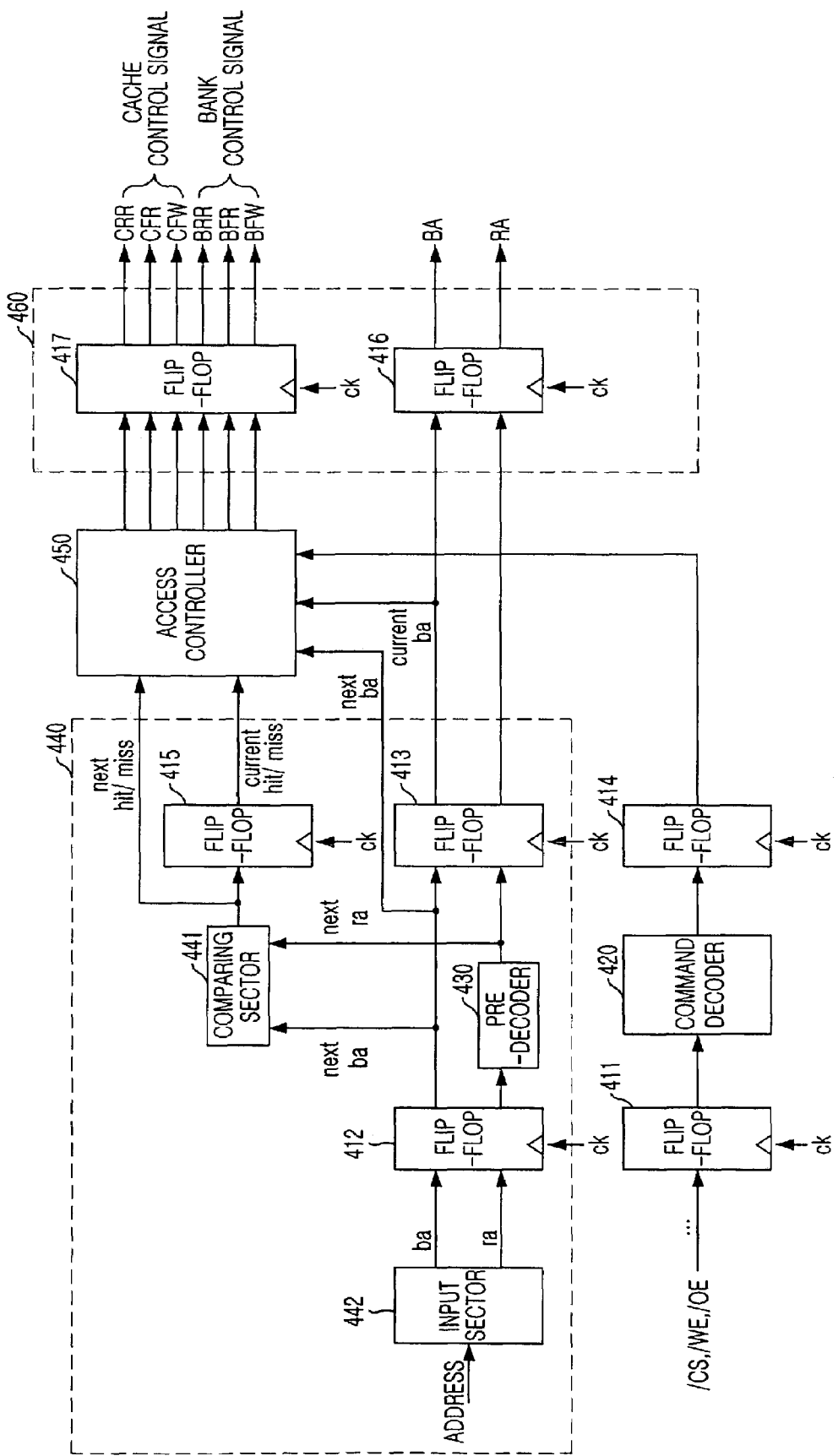
FIG. 3 represents a block diagram of a control unit employed in the DRAM shown in FIG. 1.

FIG. 3 shows a block diagram for the control unit 400 shown in FIG. 1.

As shown in FIG. 3, the control unit 400 includes an address comparator 440 for confirming if there are the data corresponding to address signals, i.e., bank address and row address in the first and the second cache banks 200 and 300 or not, an access controller 450 for generating control signals CRR, CFR and CFW to control the data access of the first and the second cache banks 200 and 300 according to the compared result from the address comparator 440 or producing control signals BRR, BFR and BFW to control the data access of the normal bank unit 100, and a command decoder 420 for controlling the access controller 450 in response to control signals /CS, /WE and /OE.

And, the address comparator 440 contains an input sector 442 for receiving address signals and classifying the address signals into a bank address ba corresponding to one of the plurality of banks and a cell address ra corresponding to one of a multiplicity of unit cells in a bank, and a comparing sector 441 for receiving the bank address ba and the cell address ra and comparing them with bank addresses and cell addresses corresponding to data stored in the cache bank unit 600.

Furthermore, the address comparator 440 has a first flip-flop 412 for synchronizing the bank address ba and the cell address ra with a clock ck and outputting them to the comparing sector 441, a pre-decoder 430 for decoding the cell address ba from the first flip-flop 412 and transmitting it to the comparing sector 441, a second flip-flop 412 for synchronizing the cell address ra from the pre-decoder 430 and the bank address ba from the first flip-flop 412 with the clock ck and outputting them, and a third flip-flop 415 for latching and synchronizing output signals next hit/miss from the comparing sector 441 with the clock ck.

The access controller 450 uses a signal current hit/miss from the third flip-flop 413 as a judgment signal to control the normal bank unit 100 and the cache bank unit 600 at a current clock, uses a signal next hit/miss from the comparing sector 441 as a judgment signal to control the normal bank unit 100 and the cache bank unit 600 at a next clock, uses a bank address next ba from the first flip-flop 412 as a bank address to access data at the next clock, and uses a bank address current ba from the second flip-flop 413 as a bank address to access data at the current clock, respectively.

The control unit 400 further includes an output latch sector 460 for setting the output timing of the data control signals CRR, CFR, CFW from the access controller 450 to control the normal bank unit 100 or the cache bank unit 600, and the output timing of the cell address ra and the bank address ba from the second flip-flop 412.

The output latch sector 460 is constructed by two flip-flops 416 and 417.

Also, the control unit 400 further includes a fourth flip-flop 411 for latching the control signals /CS, /WE, /OE, etc. and outputting them to the command decoder 420 to synchronize the control signals /CS, /WE, /OE, etc. with the output signal from the first flip-flop 412, and a fifth flip-flop 414 for latching the output signal from the command decoder 420 and outputting it to the access controller 450 to synchronize the output signal from the command decoder 420 with the output signal from the second flip-flop 413.

Figure 4:
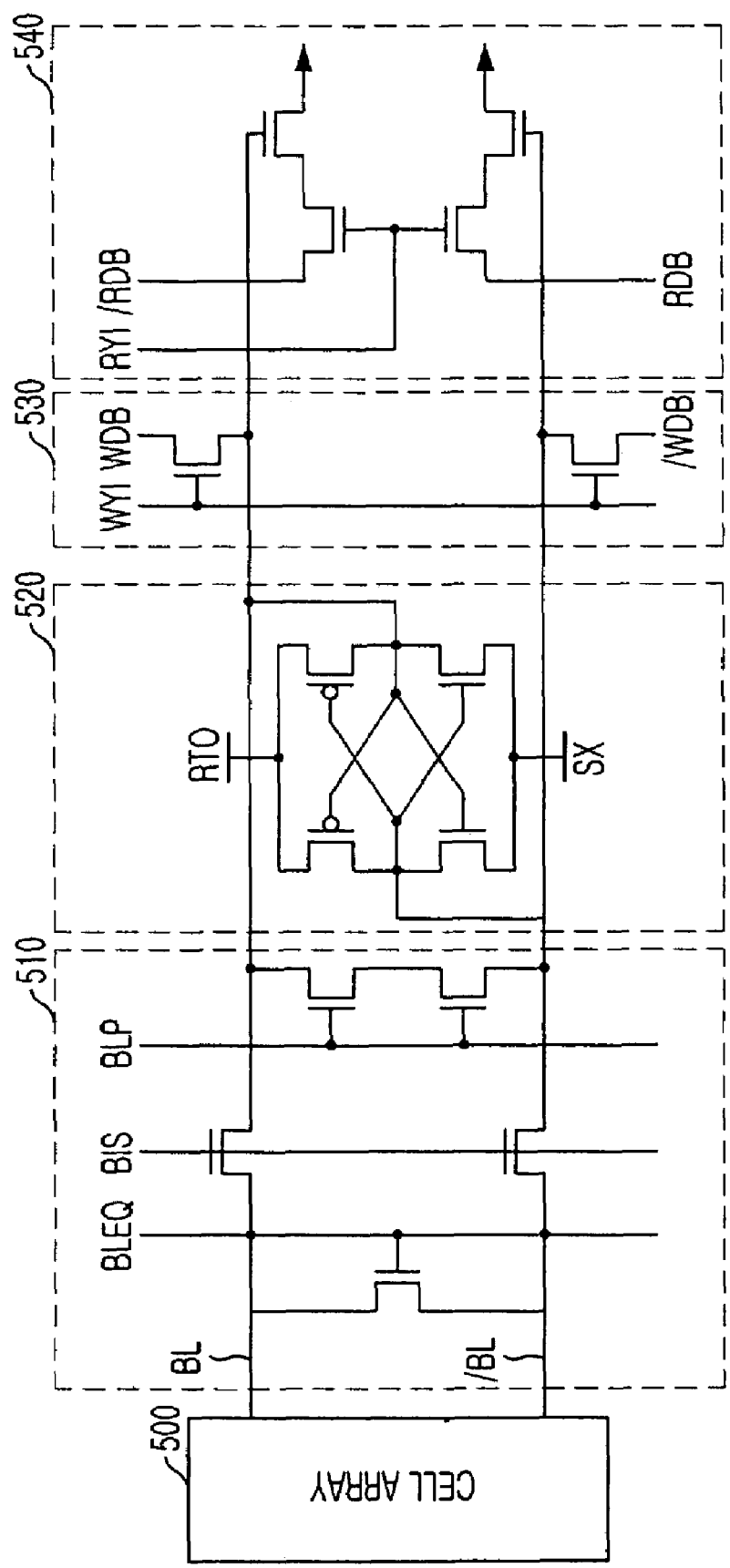
FIG. 4 is a circuit diagram of a sense amplifier included in each bank of the DRAM shown in FIG. 1.

Referring to FIG. 4, there is shown a circuit diagram of a sense amplifier unit included in each bank shown in FIG. 1.

As shown in FIG. 4, the sense amplifier unit includes a sense amplifier 520 for sensing and amplifying a signal that is supplied to bit lines BL and /BL connected to a unit cell of a cell array 500, a pre-charging sector 510 for precharging the bit lines BL and /BL by shorting or isolating between the sense amplifier 520 and the cell array 500, a data input sector 530 for providing a data path to store data in a unit cell of the cell array 500, and a data output sector 540 for outputting the amplified signal from the sense amplifier 520.

FIGS. 5 to 12 show waveform diagrams representing an operation of the DRAM shown in FIG. 1, respectively.

Hereinafter, the operation of the inventive DRAM is described with reference to FIGS. 1 to 12.

Since the inventive DRAM has the normal bank structure, the data is outputted and re-written in one bank by a 2-way interleaving mode when there are continuous access in each other bank. And, during a re-writing period, another bank can output data. Therefore, the access time tRC of the DRAM with the interleaving mode is half of that of a conventional DRAM.

Figure 5:
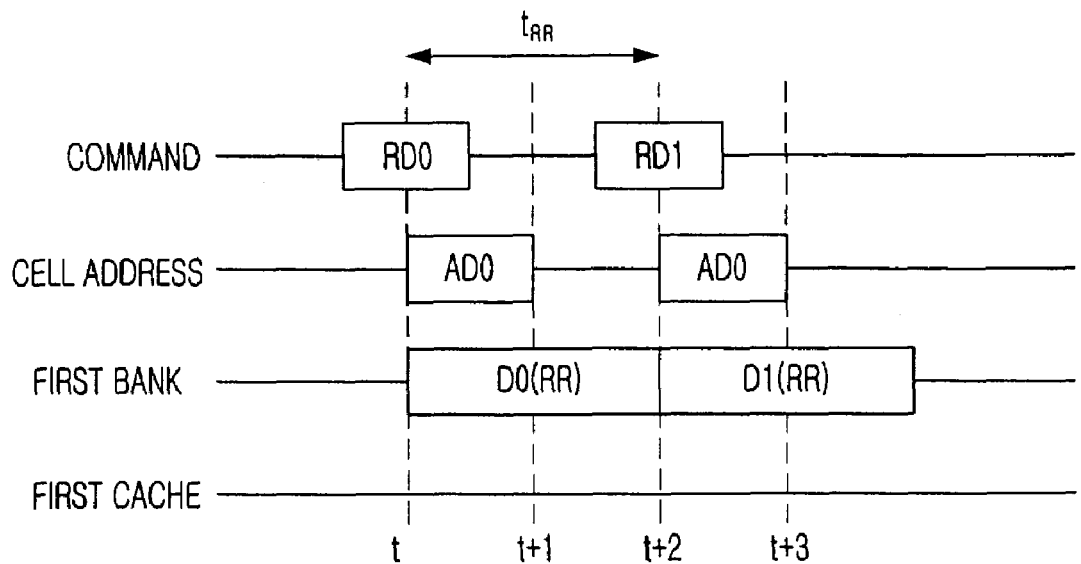
FIGS. 5 to 12 show waveform diagrams representing an operation of the DRAM shown in FIG. 1, respectively.

FIG. 5 provides a waveform diagram of a data output without the interleaving mode when data is accessed by a different bank. On the other hand, FIG. 6 shows a waveform diagram of a data output with the interleaving mode when data is accessed by a different bank.

Referring to FIG. 5, in the conventional DRAM, when a first read command RD0 is inputted, a first data D0 corresponding to a first address AD0 is outputted from the first bank, after that, when a second read command RD1 is inputted, a second data D1 corresponding to a second address AD1 is also outputted from the first bank. In this case, a required time for the data output is 'tRR' including an output time and a re-writing time, wherein tRR presents the required time for the data output in the conventional DRAM.

Figure 6:
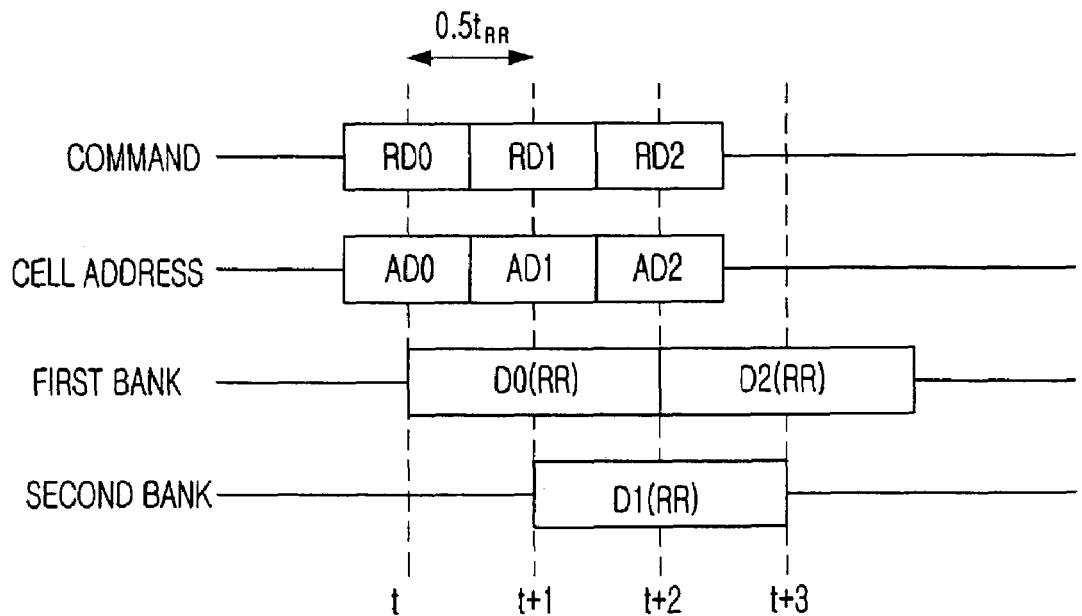

Continuously, as shown in FIG. 6, in the inventive DRAM with the interleaving mode, when the first read command RD0 is inputted, the first data D0 corresponding to the first address AD0 is outputted from the first bank, after that, when the second read command RD1 is inputted, the second data D1 corresponding to the second address AD1 is outputted from the second bank. Continuously, when a third read command RD2 is inputted, a third data D2 corresponding to a third address AD2 is outputted from the first bank again. In this case, since the second and the third data D1 and D2 are outputted continuously after the first data D0 is outputted, the required time for the data output becomes 0.5tRR. This is because a bank can output the data continuously during another bank re-writes data. As a result, the required time for data output with the interleaving mode is 0.5tRR when the data is outputted alternately with each other bank.

However, as described above, in the interleaving mode, the required time for the data output becomes tRR as shown FIG. 5 when using the data access pattern for accessing only one bank continuously.

The present invention proposes two cache banks having the same structure as that of the normal bank and a micro core operation that is a command to output the data with high-speed in order to keep the access time below '0.5tRR' when using the data access pattern for accessing only one bank continuously.

In the conventional DRAM, the operation of the read mode is following: word line activation->charge sharing->sensing->restoring->pre-charge. The micro core operation that is proposed in the present invention includes a fast read command tFR and a fast write command tFW. The operation of the fast read command tFR is following: word line activation->charge sharing->sensing->pre-charge. And the operation of the fast write command tFW is following: word line activation->restoring->pre-charge.

First of all, when the read command and the address are inputted, data corresponding to them is outputted by the operation of the fast read command tFR. Since the fast read command do not restore the data, the bit lines keep the state of the charge sharing. Here, the data can be read continuously just by the operation of the sense amplifier. In other words, since there is not required a time for restoring the data, the data can be outputted within '0.5tRR' that is the access time in the interleaving mode.

In this case, since the data that has read once is not restored in a cell and may be lost, the fast write command tFW helps the data to be preserved by storing the data in a cache bank at the moment of a read operation.

The fast write command tFW requires more time than the fast read command tFR since writing data requires more time than reading data, generally. Therefore, the DRAM in accordance with the present invention is designed with following conditions: tFR<=tFW<=0.5tRR.

Figure 7:
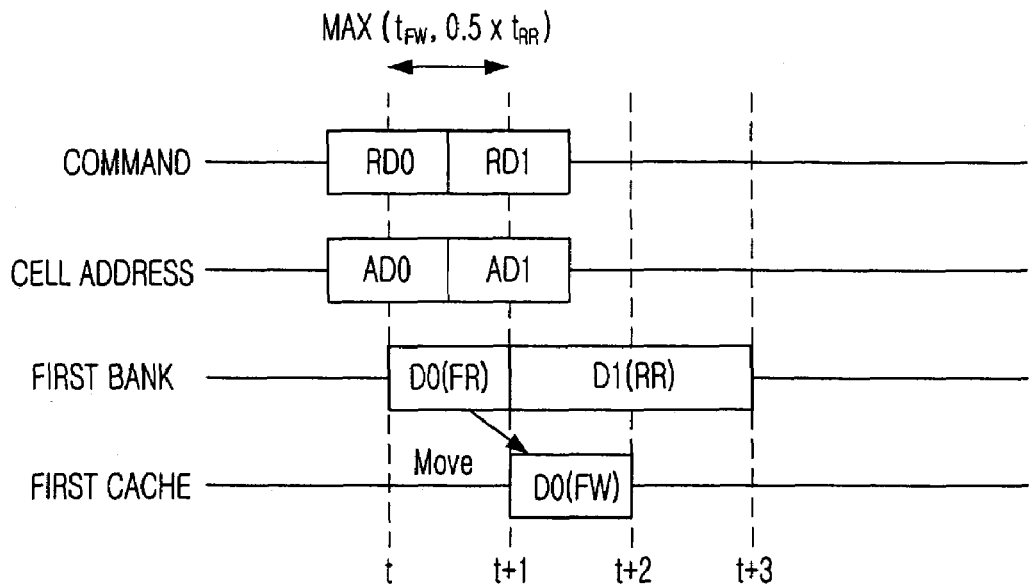

FIG. 7 provides an operational waveform diagram when data is outputted from a bank continuously by using the fast read command and the fast write command described above.

As shown in FIG. 7, when the first read command RD0 is inputted, the first data D0 corresponding to the first cell address AD0 is outputted from the first bank. In this case, the fast read command tFR makes the data D0 outputted without restoring, and on the other hand, the fast write command tFW makes the data D0 moved and stored in the cache bank. Here, the cell addresses AD0 to AD11 represent addresses in one bank.

Continuously, according to the inputted second command RD1, the second data D1 corresponding to the second cell address AD1 is outputted. In this case, since it is not required to output the data continuously, the data is restored according to the former read command. Here, MAX (tFW, 0.5*tRR) means that the operation time for the fast write command tFW should be smaller than 0.5tRR.

Figure 8:
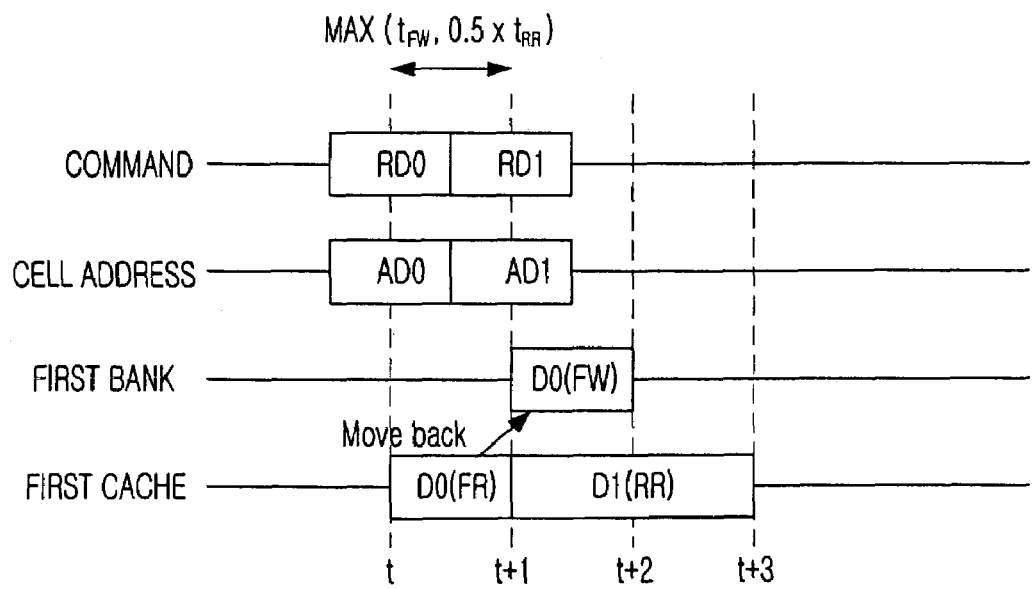

FIG. 8 is a waveform diagram when the same data is outputted from the cache bank continuously after the data is outputted from the first bank. That is, FIG. 8 shows the operation when there is continuous data in the same cache bank.

Referring to FIG. 8, when the first read command RD0 is inputted, the first data D0 corresponding to the first cell address AD0 is outputted from the first cache bank. Here, the control unit 400 receives the first cell address AD0 and determines the cache bank hit or miss to control the first cache bank. Therefore, the first data D0 is outputted from the first cache bank, and according to the second command RD1, the second data D1 corresponding to the second cell address AD1 is also outputted from the first cache bank.

Here, since the second read command RD1 is following the first data D0, in sequence, the second data D1 corresponding to the second cell address AD1 is also in the first cache bank (when continuous hit is occurred in the first cache bank). In this case, because there is no time to restore the first data D0 that is outputted previously, at the same time of the first data D0 is outputted, the first data D0 is moved back to the first bank that had stored the first data D0 by using the fast write command tFW, and then the second data D1 is outputted. The second data D1 can be stored normally. Therefore, whenever continuous data are outputted from the first cache bank, the data can be outputted within '0.5tRR'.

In order to operate as described above, the address comparator 440 of the control unit 400 in FIG. 3 receives addresses next ba and next ra for a next operation, determines both the next hit/miss for the next addresses and the current hit/miss for the current addresses, simultaneously, and outputs them to the access controller 450. And the controller 450 outputs the control signals BRR, BFR and BRW) for the bank and the control signals CRR, CFR and CFW for the cache bank in response to each command to the normal bank unit 100 and the cache bank unit 600, simultaneously.

Figure 9:
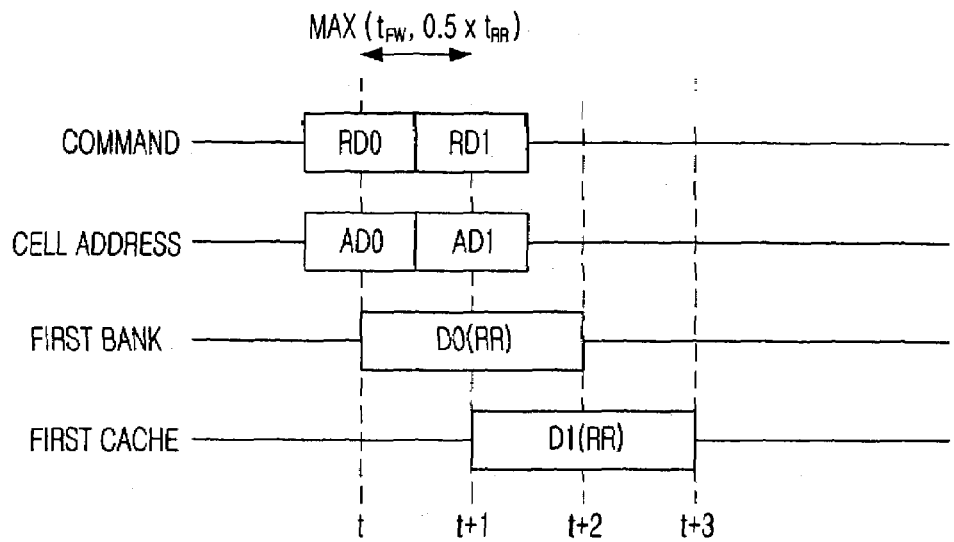

FIG. 9 provides an operational waveform diagram for showing the interleaving operation between the normal bank and the cache bank when a piece of data is outputted from the normal bank and another piece of data is outputted from the cache bank in case continuous data are accessed from one bank.

As described in FIG. 9, when the first read command RD0 is inputted, the first data D0 corresponding to the first cell address AD0 is outputted from the first bank. Continuously, when the second read command RD1 is inputted, the second data D1 corresponding to the second cell address AD1 is outputted from the first cache bank. In this case, it looks like that the data are outputted continuously within 0.5tRR on the outside although each data is restored without operations of the fast read command tFR and the fast write command tFW.

Figure 10:
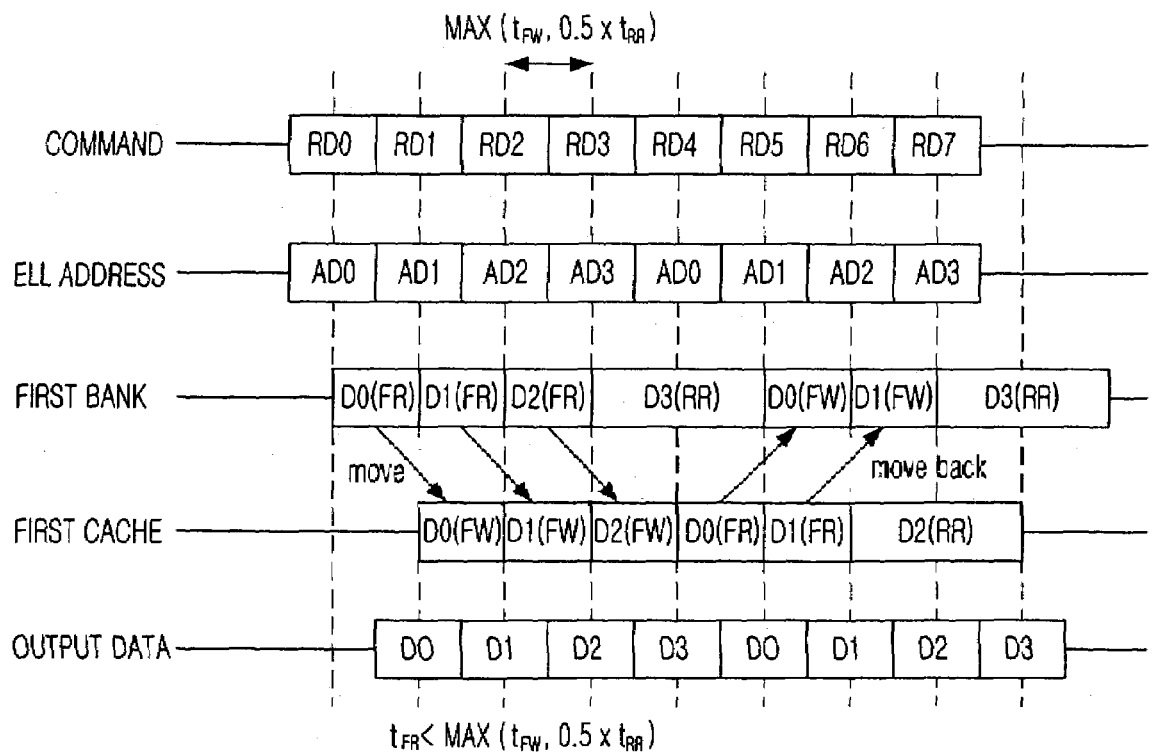

FIG. 10 represents an operational waveform diagram when four continuous accesses occur in one bank and, then, other four continuous accesses occur in the same bank. Herein, all of the first read command RD0 to a eight read command RD7 are access commands for one bank.

Referring to FIG. 10, when the first read command RD0 is inputted, the first data D0 corresponding to the first cell address AD0 is outputted from the first bank according to the fast read command tFR. At the same time, the first data D0 is moved to the first cache bank in response to the fast write command tFW. Continuously, the second and the third data D1 and D2 corresponding to the second and the third read command RD1 and RD2 are outputted in response to the fast read command tFR. At the same time, the second and the third data D1 and D2 are moved to the first cache bank.

Subsequently, when the fourth read command RD3 is inputted, the fourth data D3 corresponding to the fourth cell address AD3 is outputted from a bank according to not the fast read command tFR but the conventional read command by which a normal restoring operation is performed. This is because the next data can be outputted from the first cache bank directly since the next data to be outputted is stored in the first cache bank.

Then, when the fifth and the sixth read commands RD4 and RD5 are inputted, the first and the second data D0 and D1 are outputted from the first cache bank in response to the fast read command tFR. At the same time, the first and the second data D0 and D1 are moved again to the first bank according to the fast write command tFW. After then, for the seventh read command RD6, the third data D2 is outputted from the first cache bank, and for the eighth read command RD7, the fourth data D3 is outputted from the first bank, respectively. It is not required to use the fast read command tFR and the fast write command tFW for the seventh and the eighth read commands RD6 and RD7. This is because the data can be outputted by performing the interleaving operation since the data D2 and D3 are stored in the first bank and the first cache bank.

Therefore, it looks like that the data are outputted at every 0.5tRR on the outside when the data are outputted from one bank continuously.

Figure 11:
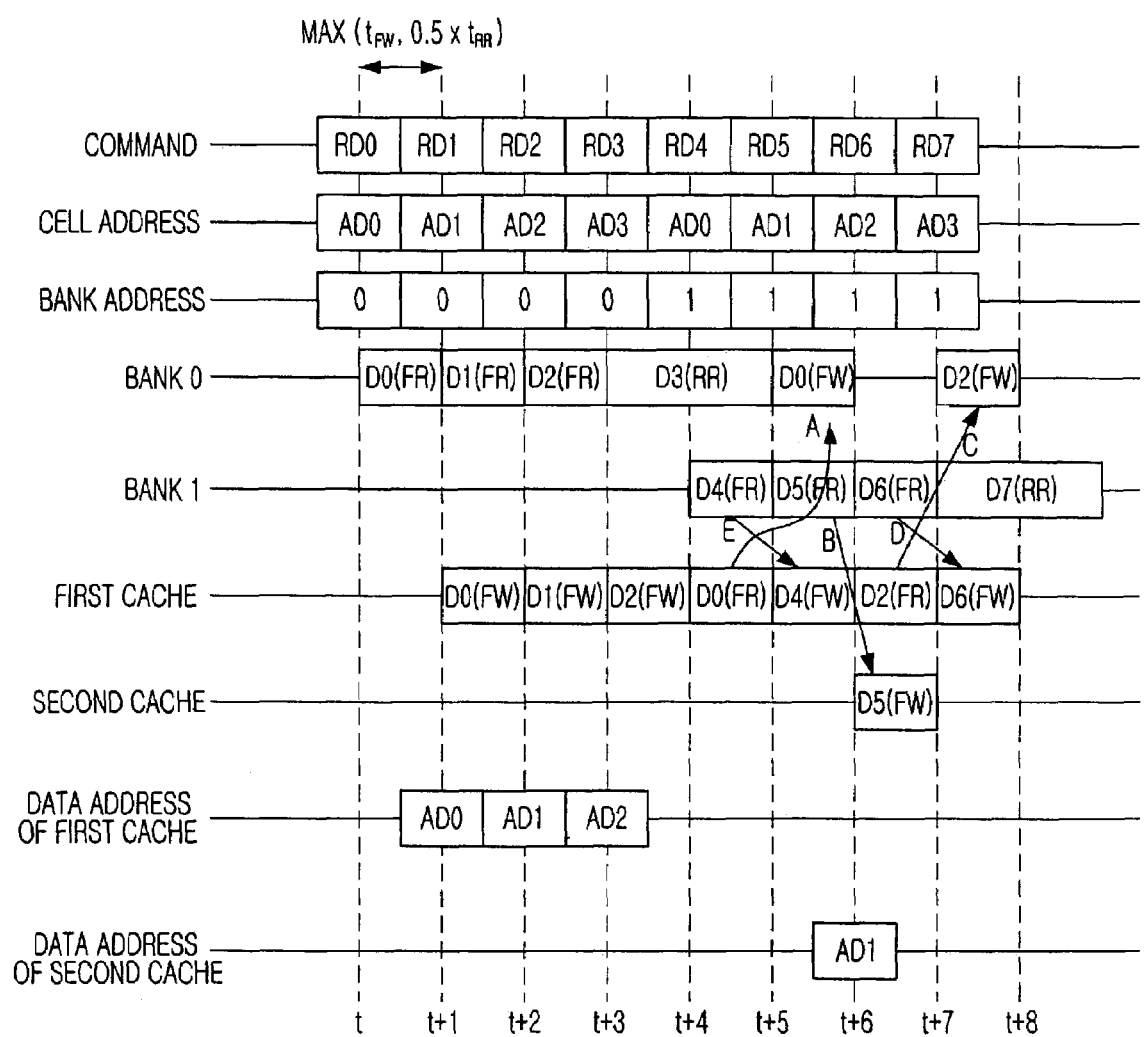

FIG. 11 describes a waveform diagram for showing the data access operation when four continuous data accesses occur in one bank and, subsequently, four continuous data accesses occur in another bank.

As shown in FIG. 11, when the first read command RD0 is inputted, the first data D0 corresponding to the first cell address AD0 is outputted to the first bank in response to the fast read command tFR. At the same time, the first data D0 is moved to the first cache bank according to the fast write command tFW. After then, the second and the third data D1 and D2 for the second and the third read commands RD1 and RD2 are outputted in response to the fast read command tFR. At the same time, the second and the third data D1 and D2 are moved to the first cache bank according to the fast write command tFW. Subsequently, when the fourth read command RD3 is inputted, the fourth data D3 corresponding to the fourth cell address AD3 is outputted from the bank and, in this case, the restoring operation is occurred according to not the fast read command tFR but the conventional read command. Hereinbefore, the operation is identical to that of FIG. 10.

And, when the fifth read command RD4 is inputted, the fifth data D4 corresponding to the first cell address AD0 of the second bank is outputted from the second bank in response to the fast read command tFR. At the same time, the fifth data D4 is moved to the first cache bank under the control of the fast write command tFW (E in FIG. 11). In this case, since the first data D0 is already stored in the cell corresponding to the address AD0 of the first cache bank to which the fifth data D4 will be moved, the first data D0 is moved again to the first bank from the first cache bank before the fifth read command RD4 is executed (A in FIG. 11).

Continuously, for the sixth and the seventh read commands RD5 and RD6, the sixth and the seventh data D5 and D6 corresponding to the cell addresses AD1 and AD2, respectively, in the second bank are outputted from the second bank in response to the fast read command tFR. At the same time, the sixth data D5 is moved to the second cache bank according to the fast write command tFW and the seventh data D6 is stored in the first cache bank in response to the fast write command tFW (D in FIG. 11). Here, since there is already the data D1 in the first cache bank, corresponding to the same address A1 in the first bank, the sixth data D5 is moved not to the first cache bank but to the second cache bank (B in FIG. 11). Also, the seventh data D6 is moved to the first cache bank because the third data D2 is moved again to the first bank (C in FIG. 11).

As described above, two cache banks are required at the data access. Therefore, if employing two cache banks, the inventive DRAM can always output the data within 0.5tRR regardless of the data pattern.

Figure 12:
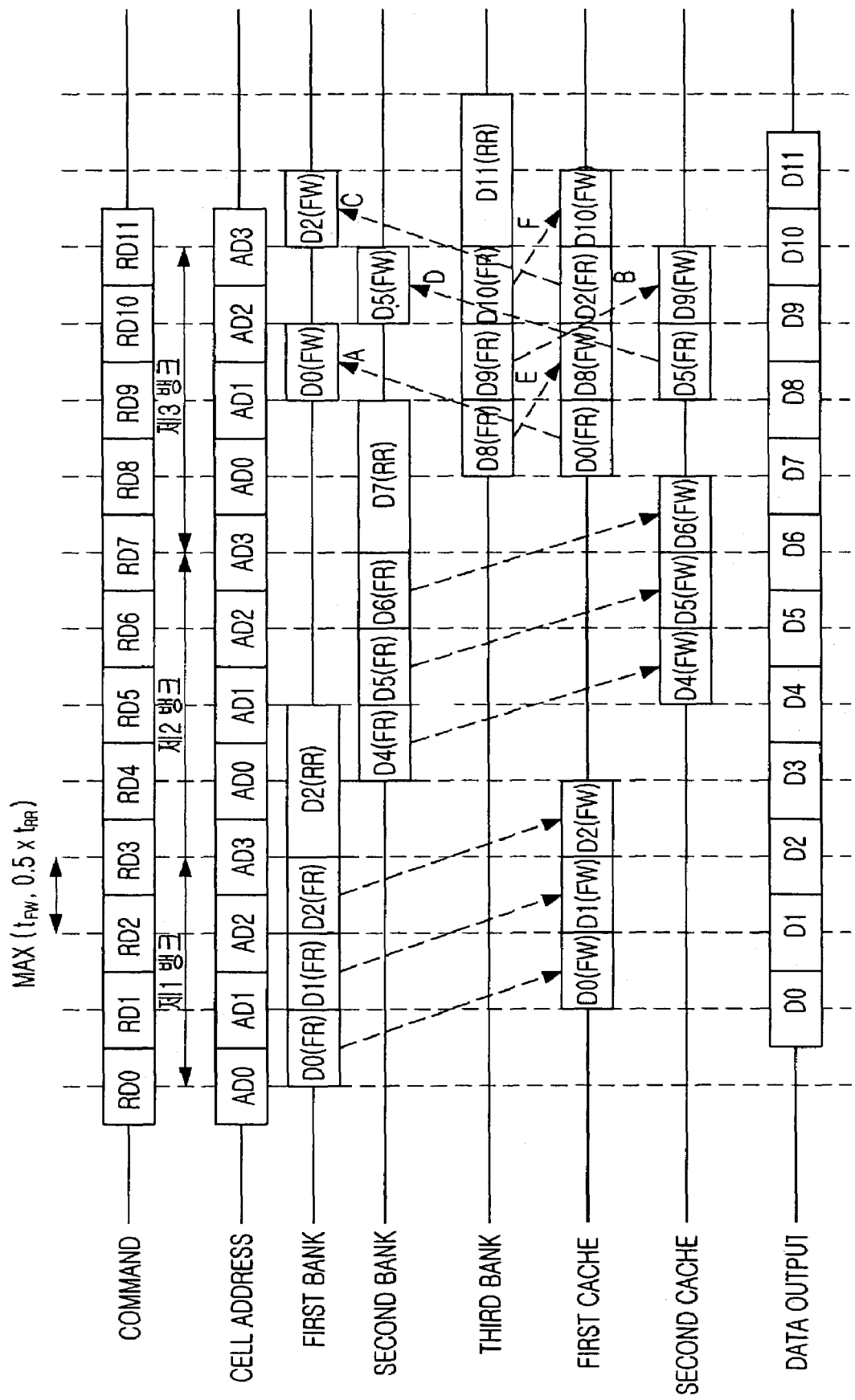

FIG. 12 provides an operational waveform diagram for showing that the data in each bank is outputted in an interval of 0.5tRR when the data in three banks are accessed continuously.

As shown in FIG. 12, for the first to the third read commands RD0 to RD2, the data D0 to D2 corresponding to the cell addresses AD0 to AD2 are outputted from the first bank according to the fast read command tFR and, at the same time, the data D0 to D2 are transmitted to the first cache bank in response to the fast write command tFW. After then, for the fourth read command RD3, the fourth data D3 corresponding to the fourth cell address AD3 is outputted from the first bank. At this time, the restoring operation is performed by a normal-speed read command not the fast read command tFR.

Consequently, for the fifth to the seventh read commands RD4 to RD6, the data D4 to D6 corresponding to the cell addresses AD0 to AD2 are outputted from the second bank according to the fast read command tFR and, at the same time, the data D0 to D2 are delivered to the second cache bank in response to the fast write command tFW. After then, for the eighth read command RD7, the eighth data D7 corresponding to the fourth cell address AD3 in the second bank is outputted from the second bank according to not the fast read command tFR but the conventional read command, which restores the data normally.

Then, when the ninth read command RD8 is inputted, the ninth data D8 corresponding to the first cell address AD0 in the third bank is outputted according to the fast read command tFR and, at the same time, the ninth data D8 is moved to the first cache bank in response to the fast write command tFW (E in FIG. 12). In this case, since the first data D0 is already stored in the cell corresponding to the address AD0 of the first cache bank to which the ninth data D8 will be moved, the first data D0 is moved again to the first bank from the first cache bank before the ninth read command RD8 is inputted (A in FIG. 12). Subsequently, for the tenth and the eleventh read commands RD9 and RD10, the tenth and the eleventh data D9 and D10 corresponding to the cell addresses AD9 and Ad10 in the third bank are outputted from the third bank in response to the fast read command tFR. At the same time, the tenth data D9 is moved to the second cache bank according to the fast write command tFW (F in FIG. 12) and the eleventh data D10 is moved to the first cache bank in response to the fast write command tFW, respectively (F in FIG. 12). Herein, since there is already the data D1 in the first cache bank, corresponding to the same address Al in the third bank, the tenth data D9 is moved not to the first cache bank but to the second cache bank (B in FIG. 12). In this case, however, the data D5 in the second cache bank should be moved again to the second bank since there is already the data D5 in the second cache bank, corresponding to the cell address AD1 in the third bank. Meanwhile, the eleventh data D10 is moved to the first cache bank since the third data D2 is moved again to the first bank (C in FIG. 12).

As described above, in the DRAM including three banks, it is required two cache banks to access the data in each bank continuously, and if a DRAM includes two cache banks, the data can be outputted within 0.5tRR on the outside continuously regardless of the data pattern.

In other words, although the number of bank is increased or the data pattern becomes more complex, the data can be outputted within 0.5tRR on the outside continuously when there are two cache banks.

In general, a required time when data '1' is written is usually longer than that when data '0' is written or read. Therefore, the present invention proposes a method, which reduces the required time to write data by supplying the high supply voltage to a buffer in a storage-path when data '1' is written.

Figure 13:
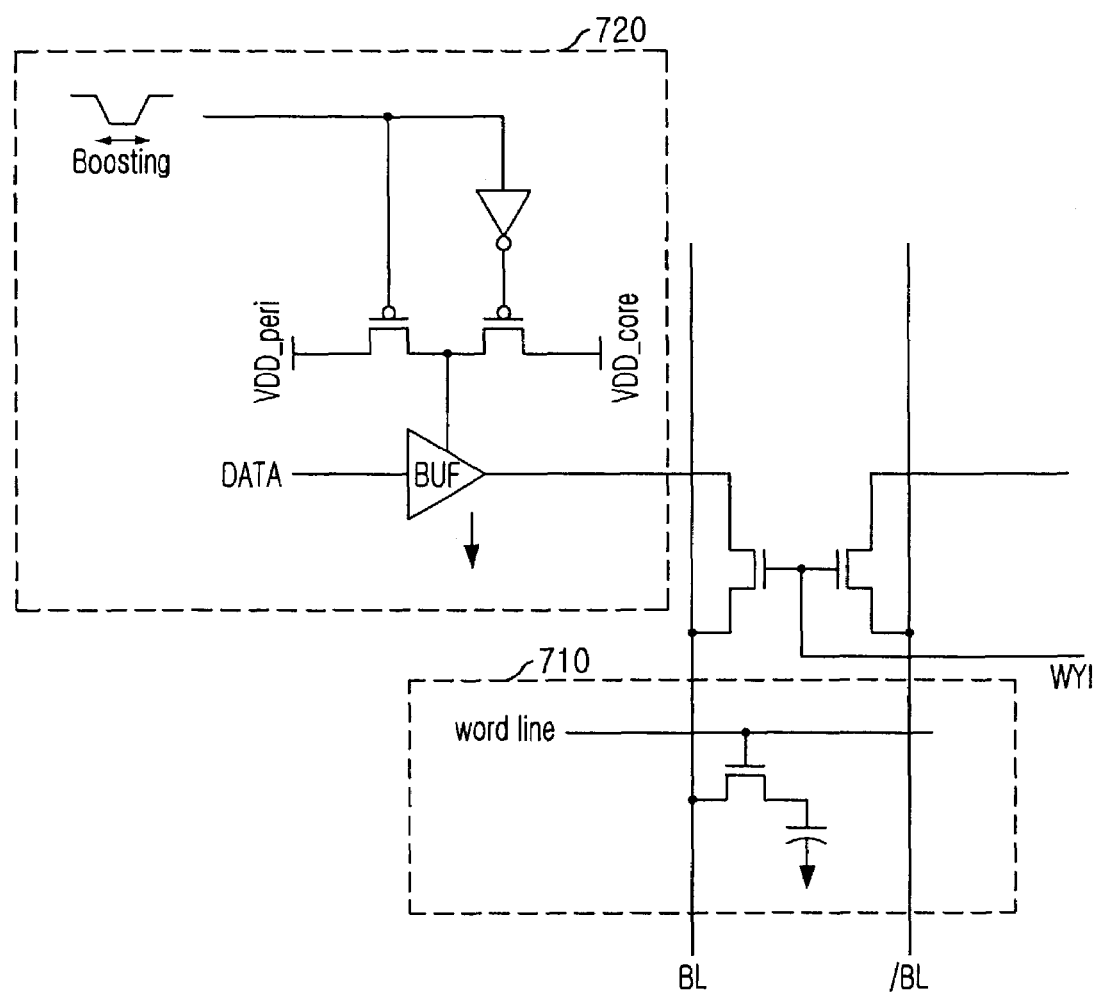
FIG. 13 is a circuit diagram of explaining a scheme to provide a data storage buffer with a supply voltage in multiple for storing data in high-speed to the DRAM shown in FIG. 1.

FIG. 13 provides a circuit diagram for supplying the multiple voltage sources to a data storage buffer for high-speed data storage in the DRAM shown-in FIG. 1.

As shown in FIG. 13, there are a unit cell 710 including a transistor and a capacitor, a data input buffer BUF 720 for selectively providing a first supply voltage VDD_core and a second supply voltage VDD_peri whose level is higher than that of the first supply voltage and a connector 730 for interconnecting the unit cell 710 and the data input buffer 720.

The first supply voltage VDD_core is usually supplied to the data input buffer 720. But, when a boosting signal for high-speed storage is inputted, it is possible to store the data more rapidly through a path X since the driving capability of the data input buffer 720 is enhanced by the second supply voltage VDD_peri that has higher voltage than the first supply voltage VDD_core, is provided to the data input buffer 720.

Figure 14:
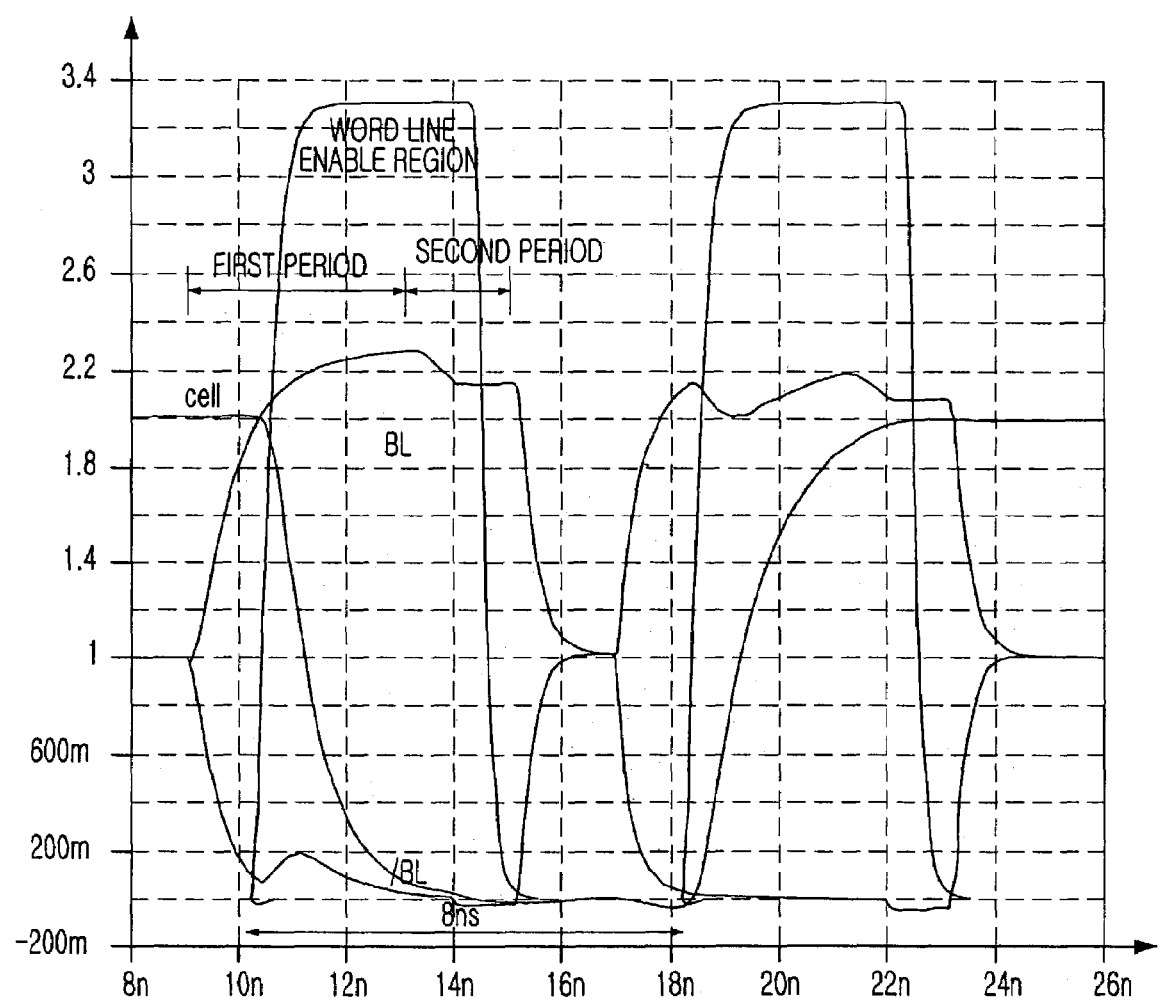
FIG. 14 provides a simulation waveform diagram to show the data storage by using the circuit shown in FIG. 13.

FIG. 14 provides a simulation waveform diagram for showing the data storage using the circuit shown in FIG. 13.

As shown in FIG. 14, during a word line is enabled, the data is stored rapidly since the second supply voltage source VDD_peri is supplied to the input buffer 720 for the first period, and the first supply voltage source VDD_core is provided to input buffer 720 for the second period.

FIG. 15 represents a simulation waveform diagram for showing the fast read command operation of the DRAM shown in FIG. 1.

As shown in FIG. 15, there had been data '1' stored in a cell 'a' and data '0' in a cell 'b'. However, it is confirmed that data '1' in the cell 'a' and data '0' in the cell 'b' are not preserved after the word lines WL a and WL b are enabled because of the absence of the restoring operation after stored data is supplied to the bit lines BL and /BL.

The present invention makes it possible to output the continuous data rapidly by using two cache banks and normal banks although banks are changed irregularly when the data is accessed. Therefore, the data can be accessed rapidly without consideration of the data pattern and there is no area penalty because two cache banks have the same structure with the unit cell of the DRAM.

While the present invention has been described with respect to the particular embodiments, it will be apparent to those skilled in the art that various changes and modifications may be made without departing from the spirit and scope of the invention as defined in the following claims.

What is claimed is:

1. A dynamic random access memory (DRAM) comprising:
   a plurality of normal banks, wherein a selected normal bank outputs at least two data continuously without restoring each data back to an original cell of the selected normal bank when continuous read commands are accessed to the selected normal bank;
   at least one cache bank, which has same data access scheme with the normal banks, for selectively storing the data outputted from a normal bank selected in response to a read command and a fast read command; and
   a controlling means for controlling an access to one of the cache banks and the plurality of normal banks and restoring the data that is outputted from the selected normal bank in response to the fast read command and stored in the cache bank into the original bank after a data access to the original bank is terminated,
   wherein the controlling means includes:
      an address comparing means for comparing if data corresponding to an address signal is in the cache bank or not;
      an access controlling means for controlling the data access of the cache bank and the normal banks according to the result from the address comparing means;
      a command decoding means for controlling the access controlling means; and
      a latching means for setting an output timing between a data control signal for controlling the normal bank or the cache bank in the access controlling means, and addresses outputted from the address comparing means.

2. The DRAM of claim 1, wherein the normal bank and the one cache bank have the same cell array.

3. A dynamic random access memory (DRAM) comprising:
   a plurality of normal banks, wherein a selected normal bank outputs at least two data continuously without restoring each data back to an original cell of the selected normal bank when continuous read commands are accessed to the selected normal bank;
   a first and a second cache bank, which have same data access scheme with the normal banks; and
   a controlling means for making data outputted according to an interleaving scheme when read access commands are accessed to different normal banks and preserving the data in one of the first and second cache banks at the moment of a read operation to restore the data that is outputted from the selected normal bank in response to the fast read command and stored in the cache bank into the original bank after a data access to the original bank is terminated,
   wherein the controlling means includes:
      an address comparing means for comparing if data corresponding to an address signal is in the cache bank or not;
      an access controlling means for controlling the data access of the cache bank and the normal banks according to the result from the address comparing means;
      a command decoding means for controlling the access controlling means; and
      a latching means for setting an output timing between a data control signal for controlling the normal bank or the cache bank in the access controlling means, and addresses outputted from the address comparing means.

4. The DRAM of claim 3, wherein the controlling means makes the data moved to the first or the second cache bank outputted and moved to the selected normal bank when the read access to the data of the selected normal bank is occurred.

5. The DRAM of claim 1, wherein the address comparing means includes:
   an input means for receiving the address signal and classifying it into a bank address corresponding to one of the normal banks and a cell address corresponding to one of unit cells in a normal bank; and
   a comparing means for receiving the bank address and the cell address and comparing them with a bank address and a cell address corresponding to the data in the cache bank.

6. The DRAM of claim 5 wherein the address comparing means further includes:
   a first flip-flop for synchronizing the bank address and the cell address from the input means with a clock to thereby output synchronized bank address and cell address to the comparing means;
   a pre-decoder for decoding the synchronized cell address from the first flip-flop to thereby output a decoded cell address;
   a second flip-flop for synchronizing the decoded cell address from the pre-decoder and the synchronized bank address from the first flip-flop with the clock; and
   a third flip-flop for latching and synchronizing an output signal from the comparing means with the clock.

7. The DRAM of claim 6, wherein the access controlling means uses the signal from the third flip-flop as a judgment signal to control the normal bank and the cache bank during a current clock, the signal from the comparing means as a judgment signal to control the normal bank and the cache bank during a next clock, the bank address signal from the first flip-flop as a bank address signal to access the data during the next clock, and the bank address signal from the second flip-flop as a bank address signal to access the data during the current clock.

8. The DRAM of claim 6 wherein the latching means is for setting an output timing between a data control signal for controlling the normal bank or the cache bank in the access controlling means, and the cell address and the bank address from the second flip-flop.

9. The DRAM of claim 8 wherein the latching means further includes:
   a fourth flip-flop for synchronizing input control signals with the output signal of the first flip-flop and outputting the synchronized control signals to the command decoding means; and
   a fifth flip-flop for latching the output signal of the command decoding means and outputting the latched signal to the access controlling means so as to synchronize the output signal of the command decoding means with the output signal of the second flip-flop.

10. The DRAM of claim 1, wherein the plurality of normal banks includes a plurality of sense amplifying means to amplify a signal stored in each unit cell
    wherein each sense amplifying means containing:
    a sense amplifier for amplifying the signal supplied to bit lines, which are connected with the unit cell in the normal bank;
    a pre-charging means for pre-charging the bit lines, or shorting or isolating between the sense amplifier and the unit cell;
    a data input means for providing a data path to store the data to the unit cell through the sense amplifier; and
    a data output means for providing a data path to output the stored data in the unit cell through the sense amplifier.

11. The DRAM of claim 1, wherein data is continuously read from the selected normal bank without restoring the data back to the selected normal bank and the data is prevented in the one cache bank at the moment of the read operation when continuous read commands are accessed to the selected normal bank.

12. A dynamic random access memory (DRAM), comprising: a plurality of normal banks selected based on a read instruction, wherein a selected normal bank outputs at least two data continuously without restoring each data back to an original cell of the selected normal bank when continuous read commands are accessed to the selected normal bank;
    at least one cache bank configured to the same scheme with the normal bank and to store data that is outputted from a selected normal bank in response to a fast read command; and
    a controlling means configured to generate a read command, the fast read command or a combination thereof based on the read instruction for controlling an access to one of the cache banks and another selected normal bank and to restore the data stored in the cache banks into the selected normal banks while the selected normal banks are not being accessed.

13. The DRAM of claim 12, wherein data responsive to the fast read command is continuously read from the selected normal bank without restoring the data back to the selected normal bank and the data is prevented in the one cache bank at the moment of a read operation when continuous read commands are accessed to the selected normal bank.

14. The DRAM of claim 13, wherein the controlling means makes the data moved to the first or the second cache bank outputted and moved to the selected normal bank when the read access to the data of the selected normal bank is occurred.

15. The DRAM of claim 13, wherein the controlling means includes:
    an address comparing means for comparing if data corresponding to an address signal is in the cache bank or not;
    an access controlling means for controlling the data access of the cache bank and the normal banks according to the result from the address comparing means; and
    a command decoding means for controlling the access controlling means; and
    a latching means for setting an output timing between a data control signal for controlling the normal bank or the cache bank in the access controlling means, and addresses outputted from the address comparing means.

16. The DRAM of claim 15, wherein the address comparing means includes:
    an input means for receiving the address signal and classifying it into a bank address corresponding to one of the normal banks and a cell address corresponding to one of unit cells in a normal bank;

a comparing means for receiving the bank address and the cell address and comparing them with a bank address and a cell address corresponding to the data in the cache bank;

a first flip-flop for synchronizing the bank address and the cell address from the input means with a clock to thereby output synchronized bank address and cell address to the comparing means;

a pre-decoder for decoding the synchronized cell address from the first flip-flop to thereby output a decoded cell address;

a second flip-flop for synchronizing the decoded cell address from the pre-decoder and the synchronized bank address from the first flip-flop with the clock; and a third flip-flop for latching and synchronizing an output signal from the comparing means with the clock.

17. The DRAM of claim 16, wherein the access controlling means uses the signal from the third flip-flop as a judgment signal to control the normal bank and the cache bank during a current clock, the signal from the comparing means as a judgment signal to control the normal bank and the cache bank during a next clock, the bank address signal from the first flip-flop as a bank address signal to access the data during the next clock, and the bank address signal from the second flip-flop as a bank address signal to access the data during the current clock.

18. The DRAM of claim 17, wherein a the latching means is for setting an output timing between a data control signal for controlling the normal bank or the cache bank in the access controlling means, and the cell address and the bank address from the second flip-flop.

19. The DRAM of claim 18, wherein the controlling means further includes:

a fourth flip-flop for synchronizing input control signals with the output signal of the first flip-flop and outputting the synchronized control signals to the command decoding means; and p1 a fifth flip-flop for latching the output signal of the command decoding means and outputting the latched signal to the access controlling means so as to synchronize the output signal of the command decoding means with the output signal of the second flip-flop.

* * * * *